US008228688B2

(12) United States Patent
Uchaykin et al.

(10) Patent No.: US 8,228,688 B2
(45) Date of Patent: Jul. 24, 2012

(54) SYSTEMS, METHODS, AND APPARATUS FOR COMBINED SUPERCONDUCTING MAGNETIC SHIELDING AND RADIATION SHIELDING

(75) Inventors: Sergey V. Uchaykin, Burnaby (CA); Alex Likhachev, Burnaby (CA)

(73) Assignee: D-Wave Systems Inc., Burnaby (CA)

( * ) Notice: Subject to any disclaimer, the term of this patent is extended or adjusted under 35 U.S.C. 154(b) by 833 days.

(21) Appl. No.: 12/262,417

(22) Filed: Oct. 31, 2008

(65) Prior Publication Data
US 2009/0122508 A1 May 14, 2009

Related U.S. Application Data

(60) Provisional application No. 60/984,321, filed on Oct. 31, 2007.

(51) Int. Cl.
*H05K 9/00* (2006.01)
(52) U.S. Cl. .......................................... 361/818; 336/84
(58) Field of Classification Search .................... 361/818
See application file for complete search history.

(56) References Cited

U.S. PATENT DOCUMENTS

| | | | | |
|---|---|---|---|---|
| 3,582,851 A | * | 6/1971 | Meservey | 336/73 |
| 3,644,987 A | * | 2/1972 | Scheffler et al. | 29/599 |
| 3,667,033 A | * | 5/1972 | Davis | 324/248 |
| 3,807,041 A | * | 4/1974 | McDougall | 29/599 |
| 4,409,579 A | * | 10/1983 | Clem et al. | 335/216 |
| 4,942,379 A | | 7/1990 | Ogawa et al. | 335/301 |
| 5,215,242 A | | 6/1993 | Kosky et al. | 228/101 |
| 6,838,694 B2 | | 1/2005 | Esteve et al. | 257/34 |
| 6,853,185 B2 | * | 2/2005 | Tsukamoto et al. | 324/248 |
| 7,335,909 B2 | | 2/2008 | Amin et al. | 257/34 |
| 2003/0218872 A1 | * | 11/2003 | Tsukada et al. | 361/816 |
| 2004/0232912 A1 | | 11/2004 | Tsukamoto et al. | 324/248 |
| 2006/0068993 A1 | | 3/2006 | Egan | 505/211 |
| 2006/0147154 A1 | | 7/2006 | Thom et al. | 385/37 |
| 2006/0225165 A1 | | 10/2006 | Maassen van den Brink et al. | 977/933 |

(Continued)

FOREIGN PATENT DOCUMENTS

JP 62105487 A * 5/1987

(Continued)

OTHER PUBLICATIONS

U.S. Appl. No. 12/017,995, filed Jan. 22, 2008, Harris.

(Continued)

*Primary Examiner* — Xiaoliang Chen
*Assistant Examiner* — Nathan Milakovich
(74) *Attorney, Agent, or Firm* — Seed IP Law Group PLLC

(57) ABSTRACT

A device is at least partially contained within a shielded enclosure formed by a first material that has a high thermal conductivity and plated with a second material that is superconductive below a critical temperature. An exterior of the shielded enclosure is at least partially wound by a compensation coil that is coupled to a current source. One or more measurement devices are responsive to magnetic fields in close proximity to the device, allowing compensation by controlling current to the compensation coil. Thus, magnetic shielding may be provided by compensation fields that may be trapped within the shielded enclosure when the system is cooled below the critical temperature of the second material. Radiation shielding may be provided by cooling the shielded enclosure to a temperature that is approximately equal to the temperature of the device.

20 Claims, 7 Drawing Sheets

U.S. PATENT DOCUMENTS

2008/0176750 A1    7/2008    Rose et al. .................... 505/170
2009/0168286 A1*    7/2009    Berkley et al. ................ 361/141

FOREIGN PATENT DOCUMENTS

JP      4276594      10/1992

OTHER PUBLICATIONS

U.S. Appl. No. 60/981,763, filed Oct. 22, 2007, Berkley et al.
U.S. Appl. No. 60/986,554, filed Nov. 8, 2007, Choi.
U.S. Appl. No. 60/984,321, filed Oct. 31, 2007, Uchaykin et al.
U.S. Appl. No. 60/039,710, filed Mar. 26, 2008, Maibaum et al.
Blatter et al., "Design aspects of superconducting-phase quantum bits," *Physical Review B 63*:174511-1-174511-9, 2001.
Feynman, "Simulating Physics with Computers," *International Journal of Theoretical Physics 21*(6/7):467-488, 1982.
Friedman et al., "Quantum superposition of distinct macroscopic states," *Nature 406*:43-46, Jul. 6, 2000.
Il'ichev et al., "Continuous Monitoring of Rabi Oscillations in a Josephson Flux Qubit," *Physical Review Letters 91*(9):097906-1-097906-4, week ending Aug. 29, 2003.
Makhlin et al., "Quantum-State Engineering with Josephson-Junction Devices," *Reviews of Modern Physics 73*(2):357-400, Apr. 2001.
Mooij et al., "Josephson Persistent-Current Qubit," *Science 285*:1036-1039, Aug. 13, 1999.
Nielsen et al., *Quantum Computation and Quantum Information*, Cambridge University Press, Cambridge, 2000, "7.8 Other implementation schemes," pp. 343-345.
Orlando et al., "Superconducting Persistent-Current Qubit," *Physical Review B 60*(22):15 398-15 413, Dec. 1, 1999.
Pobell, Matter and Methods at Low Temperatures, Springer-Verlag, Second Edition, 120-156, 1996.

\* cited by examiner

SYSTEMS, METHODS, AND APPARATUS FOR COMBINED SUPERCONDUCTING MAGNETIC SHIELDING AND RADIATION SHIELDING

CROSS REFERENCE TO RELATED APPLICATIONS

This application claims benefit under 35 U.S.C. 119(e) of U.S. Provisional Patent Application Ser. No. 60/984,321, filed Oct. 31, 2007, entitled "Systems, Methods, and Apparatus for Combined Superconducting Magnetic Shielding and Radiation Shielding", which is incorporated herein by reference in its entirety.

BACKGROUND

1. Field

The present systems, methods and apparatus relate to superconducting magnetic shielding and low-temperature infrared radiation shielding.

2. Description of the Related Art

A Turing machine is a theoretical computing system, described in 1936 by Alan Turing. A Turing machine that can efficiently simulate any other Turing machine is called a Universal Turing Machine (UTM). The Church-Turing thesis states that any practical computing model has either the equivalent or a subset of the capabilities of a UTM.

A quantum computer is any physical system that harnesses one or more quantum effects to perform a computation. A quantum computer that can efficiently simulate any other quantum computer is called a Universal Quantum Computer (UQC).

In 1981 Richard P. Feynman proposed that quantum computers could be used to solve certain computational problems more efficiently than a UTM and therefore invalidate the Church-Turing thesis. See e.g., Feynman R. P., "Simulating Physics with Computers", International Journal of Theoretical Physics, Vol. 21 (1982) pp. 467-488. For example, Feynman noted that a quantum computer could be used to simulate certain other quantum systems, allowing exponentially faster calculation of certain properties of the simulated quantum system than is possible using a UTM.

Superconducting Qubits

There are many different hardware and software approaches under consideration for use in quantum computers. One hardware approach uses integrated circuits formed of superconducting materials, such as aluminum or niobium. The technologies and processes involved in designing and fabricating superconducting integrated circuits are similar in some respects to those used for conventional integrated circuits.

Superconducting qubits are a type of superconducting device that can be included in a superconducting integrated circuit. Superconducting qubits can be separated into several categories depending on the physical property used to encode information. For example, they may be separated into charge, flux and phase devices, as discussed in, for example Makhlin et al., 2001, Reviews of Modern Physics 73, pp. 357-400. Charge devices store and manipulate information in the charge states of the device, where elementary charges consist of pairs of electrons called Cooper pairs. A Cooper pair has a charge of 2 e and consists of two electrons bound together by, for example, a phonon interaction. See e.g., Nielsen and Chuang, Quantum Computation and Quantum Information, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See e.g., U.S. Pat. No. 6,838,694 and U.S. Pat. No. 7,335,909.

Examples of flux qubits that may be used include rf-SQUIDs, which include a superconducting loop interrupted by one Josephson junction, or a compound junction (where a single Josephson junction is replaced by two parallel Josephson junctions), or persistent current qubits, which include a superconducting loop interrupted by three Josephson junctions, and the like. See e.g., Mooij et al., 1999, Science 285, 1036; and Orlando et al., 1999, Phys. Rev. B 60, 15398. Other examples of superconducting qubits can be found, for example, in Il'ichev et al., 2003, Phys. Rev. Lett. 91, 097906; Blatter et al., 2001, Phys. Rev. B 63, 174511, and Friedman et al., 2000, Nature 406, 43. In addition, hybrid charge-phase qubits may also be used.

The qubits may include a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some embodiments, charge-based readout and local bias devices may be used. The readout device(s) may include a plurality of dc-SQUID magnetometers, each inductively connected to a different qubit within a topology. The readout device may provide a voltage or current. The dc-SQUID magnetometers including a loop of superconducting material interrupted by at least one Josephson junction are well known in the art.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, US Patent Publication No. 2008-0176750, U.S. Provisional Patent Application Ser. No. 60/986,554 filed Nov. 8, 2007 and entitled "Systems, Devices and Methods for Analog Processing," and U.S. Provisional Patent Application Ser. No. 61/039,710, filed Mar. 26, 2008 and entitled "Systems, Devices, And Methods For Analog Processing."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. patent application Ser. No. 12/017,995. Respective coupling strengths of the coupling devices may be tuned between zero and a maximum value, for example, to provide ferromagnetic or anti-ferromagnetic coupling between qubits.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

According to the present state of the art, a superconducting material may generally only act as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system.

BRIEF SUMMARY

At least one embodiment may be summarized as a shielding system for shielding against magnetic fields and infrared radiation, the shielding system comprising: a shielded enclosure that is open at one end, formed by a first material that has a high thermal conductivity and plated with a second material that is superconductive at and below a critical temperature; a current control system that includes at least one electrical current source; a first conductive current path that is conductively coupled to the current control system, wherein at least a portion of the shielded enclosure is within a perimeter of the first conductive current path; and a first measurement device positioned to measure magnetic fields within the perimeter of the shielded enclosure, the first measurement device communicatively coupled to the current control system.

The first measurement device may include a magnetometer. The first material may include copper metal and the second material may include tin metal. The shielding system may further comprise a device for which shielding from magnetic fields and shielding from infrared radiation are desired, wherein the device is at least partially contained within the perimeter of the shielded enclosure. The device may include a superconducting processor, such as a superconducting quantum processor.

In some embodiments, the shielding system may further comprise a second measurement device that is communicatively coupled to the current control system. In some embodiments, the first and the second measurement devices may measure approximately perpendicularly to one another. The shielding system may further comprise at least a third measurement device that is communicatively coupled to the current control system, and in some embodiments at least two measurement devices may measure approximately perpendicularly to one another.

In some embodiments, the shielding system may further comprise at least a second conductive current path, wherein the shielded enclosure is at least partially within a perimeter of each of the conductive current paths, and wherein each conductive current path is conductively coupled to the current control system. In some embodiments, at least two conductive current paths may be aligned approximately perpendicular to one another.

In some embodiments, the current control system includes at least one signal amplifier. The current control system may also include at least one digital-to-analog converter.

In some embodiments, both the inner surface and the outer surface of the shielded enclosure are plated with the second material.

At least one embodiment may be summarized as a method of shielding a device from magnetic fields and infrared radiation, the method comprising: at least partially enclosing the device within the perimeter of a shielded enclosure, wherein the shielded enclosure is formed by a first material that has a high thermal conductivity and plated with a second material that is superconductive at and below a critical temperature; measuring the magnetic fields in at least one direction in close proximity to the device; controlling at least one current through at least one conductive current path to generate at least one compensatory magnetic field; monitoring the magnetic fields in close proximity to the device; refining the at least one controlled current until the magnetic fields in close proximity to the device reach at least one desired level; trapping the at least one compensatory magnetic field within the shielded enclosure; and cooling the material that forms the shielded enclosure to a temperature that is approximately equal to the temperature of the device.

In some embodiments, the device may include a superconducting processor, such as a superconducting quantum processor. In some embodiments, trapping may include cooling the material that forms the shielded enclosure to a temperature below a critical temperature of the second material, such that the second material becomes superconducting. The method may further comprise: deactivating the controlled current once the at least one compensatory magnetic field has been trapped.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

Figure 1:
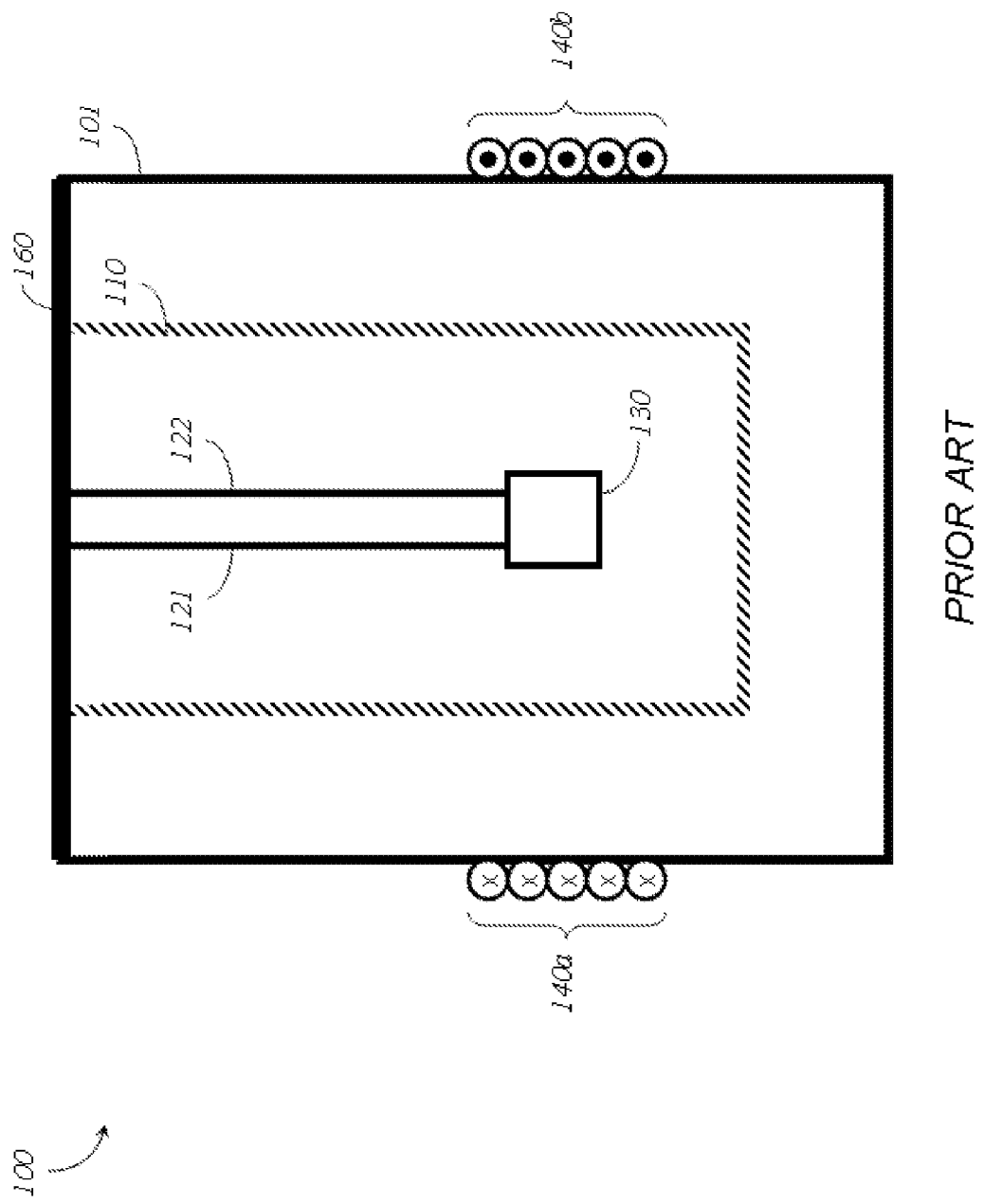
FIG. 1 is a schematic diagram of a superconducting magnetic shielding system that includes a cylindrical superconducting shield and compensation coils.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with analog processors, such as quantum processors, quantum devices, coupling devices and control systems including microprocessors and drive circuitry have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The present systems, methods and apparatus describe techniques that control the ambient magnetic field in a localized environment while also providing shielding against infrared radiation. The teachings provided herein may be applied in any system where control over the environmental magnetic fields and the environmental infrared radiation is desired. Such control may be desired in systems whose components are highly sensitive to magnetic fields and infrared radiation, such as for example, superconducting processors and superconducting quantum processors.

A known technique for reducing ambient magnetic fields in sensitive systems is to encase the system in a superconducting cylinder that is closed at one end. The superconducting cylinder may be wrapped by at least one compensation coil. At a temperature above the critical temperature of the superconducting cylinder (that is, while the superconducting cylinder is not behaving as a superconductor), the ambient magnetic field inside the cylinder is monitored with a measurement device, such as for example a magnetometer. A dc-current is passed through the compensation coil to produce at least one compensation field that interferes (either destructively or constructively, depending on the desired impact on the system) with the ambient magnetic field measured inside the cylinder. Once the desired magnetic field has been produced and maintained inside the cylinder, the temperature of the system is reduced below the critical temperature of the superconducting cylinder such that the cylinder becomes superconducting. When this occurs, the cylinder may naturally trap the magnetic flux that is being generated by the compensation coil, thereby locking the compensation fields and allowing the dc-current being applied to the compensation coil to be switched off. A similar technique is described in Japanese Patent Application JP04276594.

FIG. 1 is a schematic diagram of a superconducting magnetic shielding system 100 that includes a cylindrical superconducting shield 110 and compensation coils 140a-140b. Shield 110 (drawn with patterned lines to indicate that it is made of superconducting material) may be made of any superconducting material, for example, tin. Shield 110 may be cylindrical in geometry with a closed bottom and an open top; the top of shield 110 appears closed in FIG. 1 because shield 110 is affixed to flange 160. System 100 may be contained in a refrigeration system (not shown) which typically includes an outer shield/vacuum chamber 101. Note that FIG. 1 is a simplification of an actual shielding system, and in some systems chamber 101 and cylinder 110 may each be affixed to a different flange and a different stage in the refrigeration system. Chamber 101 may be made of non-superconducting material. Compensation coils 140a each contain an "X" to indicate that portion of the coil is directed into the page, while compensation coils 140b each contain a "dot" to indicate that portion of the coil is directed out of the page. Thus, compensation coils 140a-140b are actually connected to each other as they wrap all the way around chamber 101, going into the page at 140a, wrapping around behind (not shown) chamber 101, coming out of the page at 140b, and wrapping around in front (not shown) of chamber 101. System 100 further includes connections 121 and 122 for providing input/output communication and thermalization to device 130. Device 130 is the device for which magnetic shielding is desired, such as for example a superconducting processor chip. Throughout the remainder of this specification, various embodiments of the present systems, methods and apparatus are described that use a superconducting processor chip to represent a system for which magnetic shielding is desired. While the present systems, methods and apparatus are well-suited to shielding a superconducting processor chip, those of skill in the art will appreciate that other embodiments may be used to shield systems other than superconducting processor chips.

Figure 2:
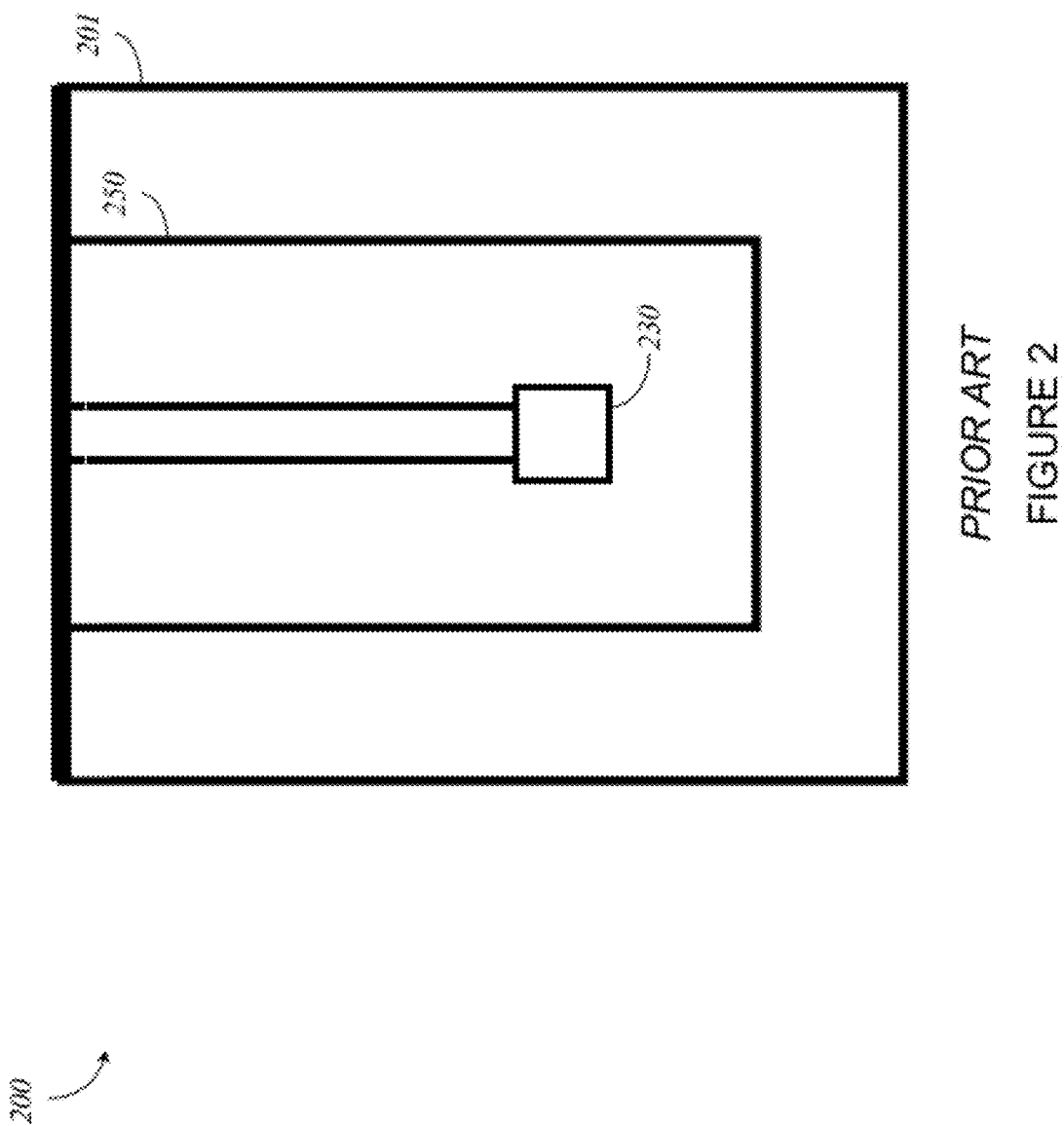
FIG. 2 is a schematic diagram of a radiation shielding system that includes a cylindrical radiation shield.

Infrared radiation can be emitted by a warm body. This radiation can then be absorbed by a colder body, thereby causing the colder body to increase in temperature. In a refrigerated environment where temperature control is desirable, it may be advantageous to consider the effects of infrared radiation. For instance, most refrigeration systems, such as dilution refrigeration systems, include various stages where each stage may be approximately maintained at a specific temperature. A warmer stage within such a refrigeration system may radiate heat in the infrared spectrum, and this heat may be absorbed at a colder stage and cause at least a portion of the colder stage to increase in temperature (or else, this heat may cause an increase in the demand for cooling power at the colder stage in order to approximately maintain the colder temperature). Thus, it can be advantageous to thermally shield a colder stage in a refrigeration system from a warmer stage in the refrigeration system. For example, a typical refrigeration system may include an internal radiation shield. FIG. 2 is a schematic diagram of a radiation shielding system 200 that includes a cylindrical radiation shield 250. System 200 may be contained in a refrigeration system (not shown) which typically includes an outer shield/vacuum chamber 201. In a typical refrigeration system, chamber 201 may be cooled to a specific temperature level, for example about 4K. While chamber 201 may serve to shield its contents from external radiation, chamber 201 may itself radiate infrared frequencies that correspond to the temperature of chamber 201 (e.g., about 4K). Because chamber 201 can be several orders of magnitude warmer than the base temperature of the refrigeration system (that is, the temperature of device 230 in system 200), this infrared radiation can significantly and undesirably affect the temperature of device 230 contained within chamber 201. For this reason, many refrigeration systems include a radiation shield 250 that is nested within chamber 201 and cooled to a temperature that is colder than that of chamber 201. Shield 250 may be used to shield device 230 from the infrared radiation that is emitted by chamber 201. In order to prevent shield 250 from subsequently radiating energy inwards towards device 230, shield 250 may be cooled to or close to the base temperature of the refrigeration system.

In many applications, it is desirable that shield 250 be made of a material that has a high thermal conductivity to ensure that infrared radiation that is absorbed from chamber 201 is readily dispelled from shield 250 by thermal contact(s) with the refrigeration system (not shown). When shield 250 absorbs infrared radiation, it increases in temperature and becomes a warm body itself. This means that shield 250 may actually emit infrared radiation as well. The total energy of the infrared radiation that is emitted by a warm body is proportional to the temperature of the warm body to the fourth power (i.e., proportional to $T^4$). So, shield 250 is most effective when it maintains the lowest possible temperature when absorbing infrared radiation. Thus, it is advantageous for shield 250 to have a high thermal conductivity so that the energy of infrared radiation that it absorbs is readily distributed throughout its whole volume (and at least partially dispelled by thermal contact with the refrigeration system), thereby minimizing the increase in the temperature of the shield 250. If shield 250 were made of a material with a low thermal conductivity, then the absorption of infrared radiation would result in localized heating in regions of shield 250, where each warm region would then radiate with energy proportional to $T^4$. Thus, typically, a radiation shield such as shield 250 may be made of a material with high thermal conductivity, such as copper metal. Throughout this specification and the appended claims, various materials are described as having a "high" thermal conductivity. The term "high" in this case is intended to mean "suitably high" or "appropriately high" in order to satisfy the requirements of the shielding material. Furthermore, it can be advantageous to design shield 250 to be reflective so that at least a portion of the infrared radiation emitted by chamber 250 is reflected from shield 250 rather than being absorbed by shield 250. Thus, typically, a radiation shield such as shield 250 may be plated with a reflective metal such as gold, and/or wrapped with a reflective material such as MYLAR®.

Figure 3:
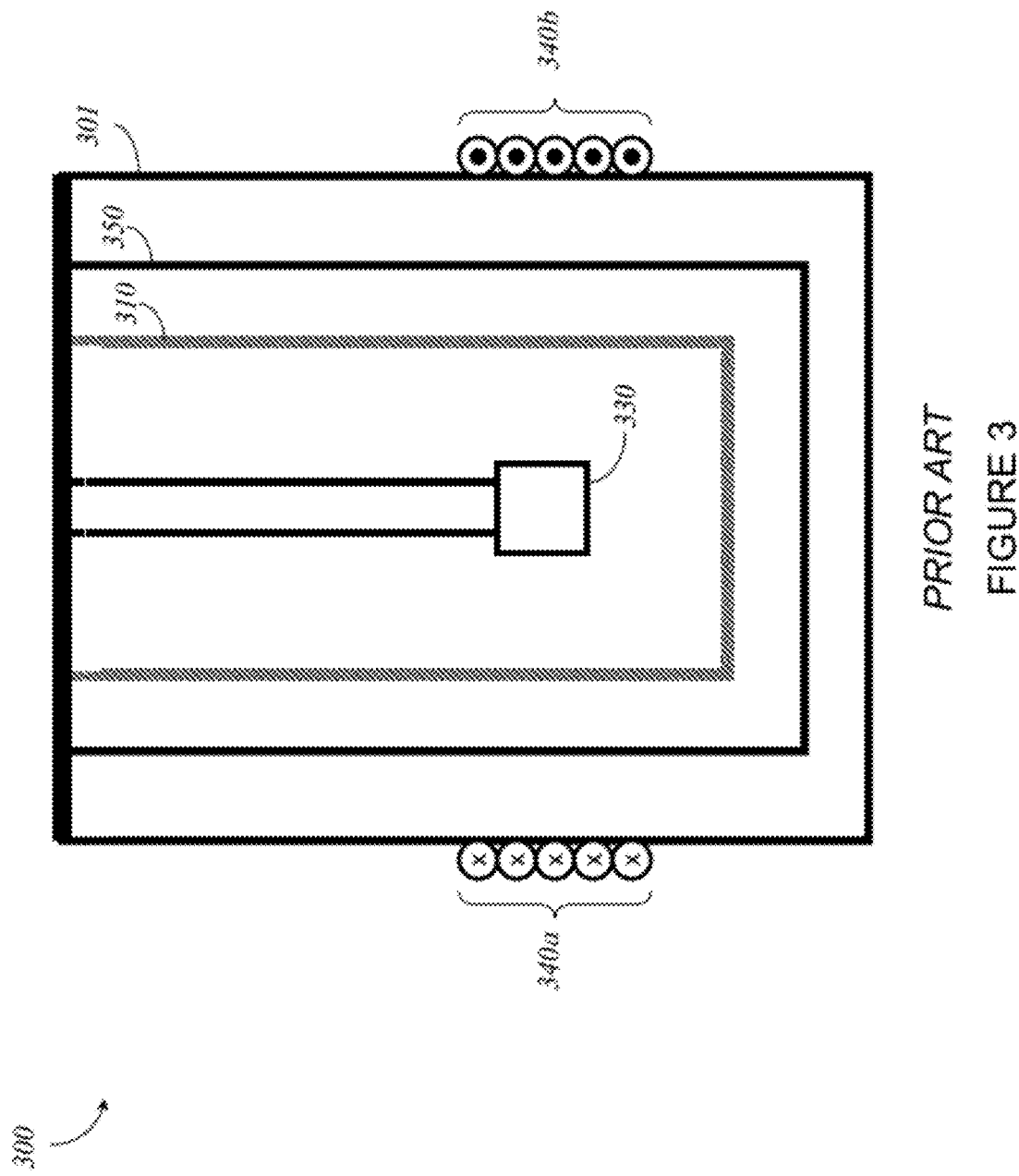
FIG. 3 is a schematic diagram of a dual-shielding system that includes both a cylindrical radiation shield and a cylindrical superconducting magnetic shield with compensation coils.

In some applications of refrigeration systems, it can be desirable to incorporate both superconducting magnetic shielding and radiation shielding. An example of such an application is the cooling of a superconducting processor such as a superconducting quantum processor. In known refrigeration systems, this dual-shielding is typically accomplished by including two cylindrical shields, one nested inside the other. FIG. 3 is a schematic diagram of a dual-shielding system 300 that includes both a cylindrical radiation shield 350 and a cylindrical superconducting magnetic shield 310 with compensation coils 340a-340b. System 300 may be contained in a refrigeration system (not shown) which typically includes an outer shield/vacuum chamber 301. Thus, chamber 301 contains cylindrical radiation shield 350, which contains cylindrical superconducting magnetic shield 310 (drawn with patterned lines to indicate that it is made of superconducting material), which contains device 330. System 300 incorporates the components and principles described respectively for system 100 and system 200 into one shielding system.

Figure 4:
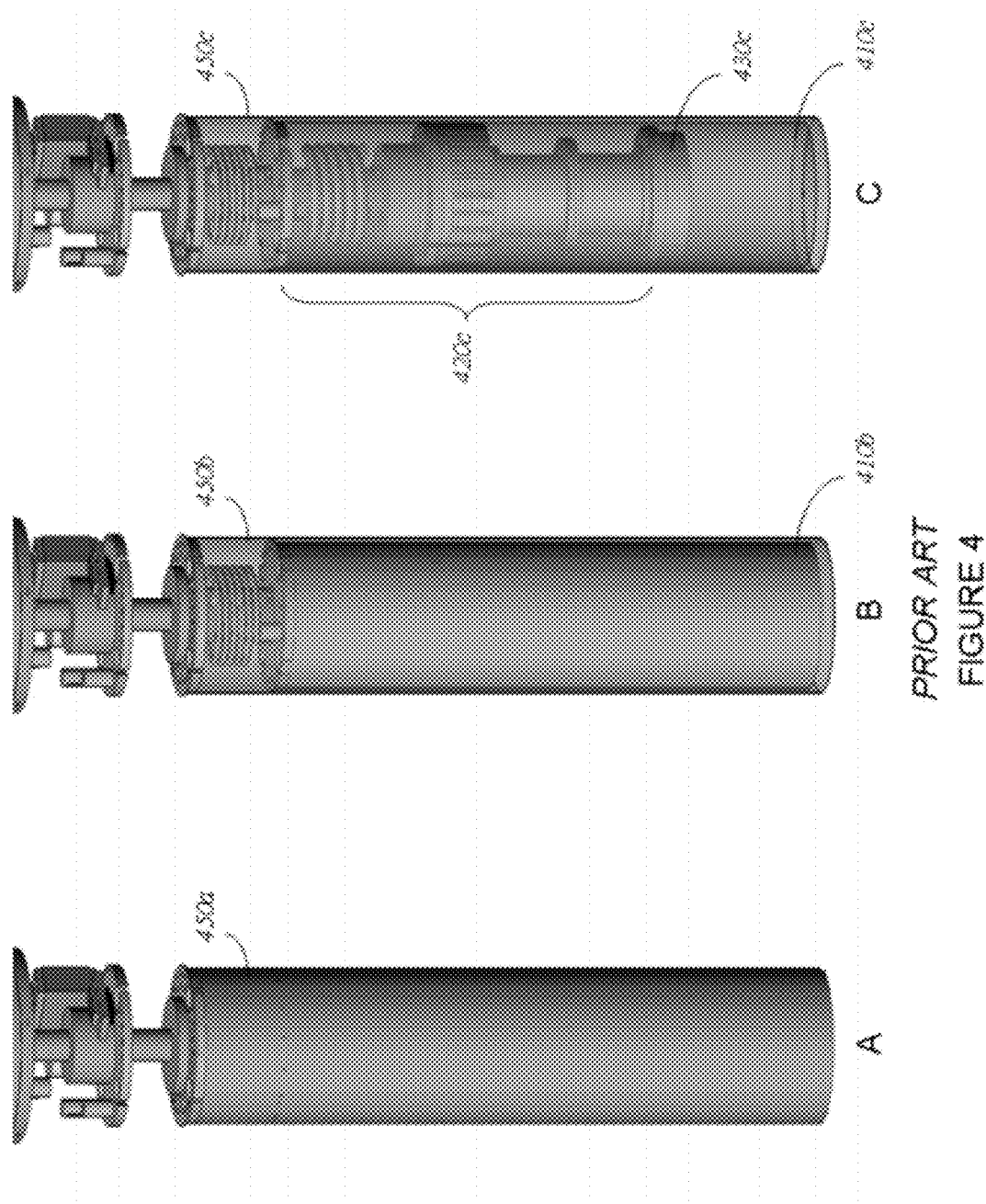
FIG. 4 shows three isometric views of the dual-shielding system from FIG. 3.

FIG. 4 shows three isometric views A-C of the dual-shielding system 300 from FIG. 3. In view A, cylindrical radiation shield 450a is opaque and its contents are not visible. In view B, cylindrical radiation shield 450b is made transparent (for illustrative purposes only) and cylindrical superconducting magnetic shield 410b is visible inside shield 450b. In view C, cylindrical radiation shield 450c is made transparent (for illustrative purposes only) and nested superconducting magnetic shield 410c is also made transparent (for illustrative purposes only) such that device 430c and input/output components 420c are visible inside shield 410c. Note that compensation coils are not illustrated in any of views A-C in FIG. 4.

While the "nested cylinder" shielding system illustrated in FIGS. 3 and 4 does successfully provide the desired dual-shielding characteristics for many applications, this approach does have its drawbacks. For example, the nested cylinder approach obviously requires at least two cylindrical shields, each of which can be labor-intensive and expensive to produce. Furthermore, each cylindrical shield can be massive and take up a lot of space inside the refrigeration system. This can be disadvantageous because the cooling of a massive shield may use up a lot of cooling power from the refrigeration system, and because space inside a refrigeration system is typically quite limited. Thus, there is a need in the art for a less expensive shielding system that provides both radiation and magnetic shielding while demanding less cooling power and taking up less space inside the refrigeration system.

The present systems, methods and apparatus describe a shielding system wherein a single cylindrical shield provides both superconducting magnetic shielding and radiation shielding. This can be advantageous over existing shielding systems because it may be less expensive to produce, it may demand less cooling power from the refrigeration system, and it may take up less space inside the refrigeration system.

Figure 5:
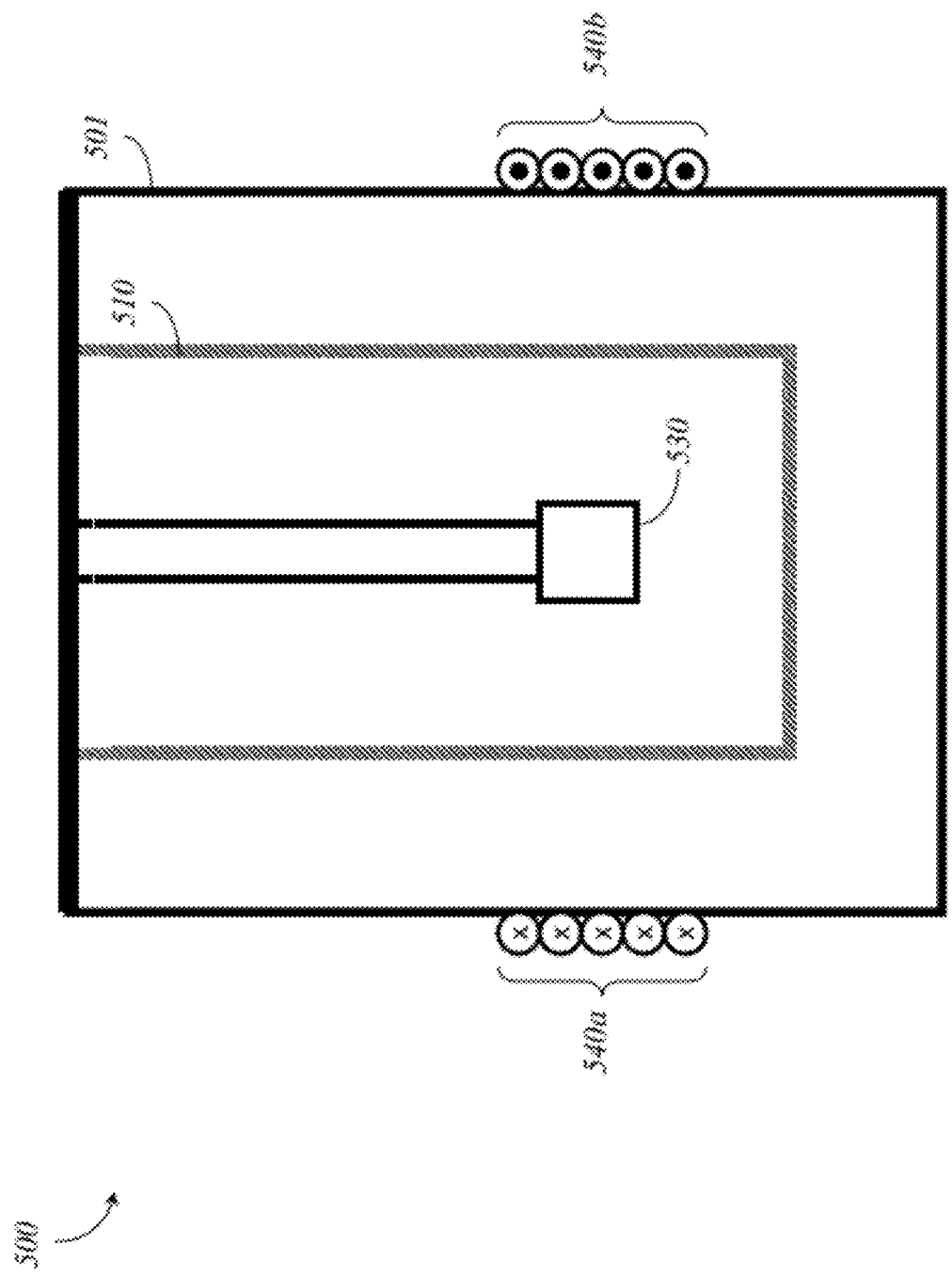
FIG. 5 is a schematic diagram of a combined shielding system that includes a cylindrical superconducting shield that provides both magnetic shielding and radiation shielding.

FIG. 5 is a schematic diagram of a combined shielding system 500 that includes a cylindrical superconducting shield 510 that provides both magnetic shielding and radiation shielding. System 500 may be contained in a refrigeration system (not shown) which typically includes an outer shield/vacuum chamber 501. Similar to system 300 from FIG. 3, system 500 incorporates the principles described for systems 100 and 200 from FIGS. 1 and 2, respectively. However, unlike system 300, system 500 incorporates these principles into a single cylindrical shield 510 rather than two nested cylindrical shields 350 and 310. Shield 510 contains device 530, which may be cooled to the base temperature of the refrigeration system and for which both radiation shielding and magnetic shielding are desired (e.g., device 530 may include a superconducting processor, such as a superconducting quantum processor). In order to behave as a radiation shield, shield 510 may be cooled to a low temperature that is approximately equal to or near to the base temperature of the refrigeration system. As was the case for shield 250 of system 200, it may be advantageous to form shield 510 with a metal that has a high thermal conductivity, such as copper. While copper is used as an example in this specification, those of skill in the art will appreciate that any material with a high thermal conductivity may be used. Using a material with a high thermal conductivity ensures that radiation that is absorbed by shield 510 is readily dispelled by thermal contact (s) with the refrigeration system. However, rather than plating the radiation shield with gold as in system 200, shield 510 may be plated with a superconducting metal such as tin. While tin is used as an example in this specification, those of skill in the art will appreciate that any superconducting material may be used to plate the copper of shield 510. Those of skill in the art will appreciate that it may be advantageous to use a superconducting material whose critical temperature is higher than the operation temperature of shield 510, such that shield 510 is superconducting in operation. The radiation shielded by shield 510 may be substantially in the infrared frequency range. It is observed that tin-plating on shield 510 provides radiation shielding that is comparable to that of gold-plating on shield 250 in system 200. In some embodiments, the reflectivity of shield 510 may be further increased by wrapping the surface of shield 510 with a reflective material, such as MYLAR®.

In some embodiments, both the outer surface and the inner surface of shield 510 (drawn with patterned lines to indicate that it includes superconducting material) may be plated with superconducting material, such as tin. In other embodiments, either just the outer surface or just the inner surface of shield 510 may be plated with superconducting material. System 500 also includes compensation coils 540a-540b which may be wrapped around a circumference that is external to shield 510. For example, in some embodiments, compensation coils 540a-540b may be wrapped around the surface of chamber 501 as illustrated in FIG. 5. In some embodiments, compensation coils may be wrapped around the surface of shield 510 itself, or around the surface of the refrigeration system itself. Those of skill in the art will appreciate that the distance between shield 510 and compensation coils 540a-540b may be accounted for during magnetic compensation, and therefore compensation coils 540a-540b may be wrapped around any surface that is external to shield 510. By controlling electric current through compensation coils 540a-540b, compensation fields may be generated that interfere with the magnetic fields existing within shield 510. In some embodiments, this interference may be tuned while shield 510 is maintained at a temperature above its critical temperature (i.e., while shield 510 is not superconducting) and the resulting magnetic fields at a point inside shield 510, for example at the point where device 530 is located, may be monitored using a measurement device such as a magnetometer. Once the desired magnetic fields are achieved at device 530, the system may be cooled below the critical temperature of shield 510, at which point shield 510 may become superconducting and trap the compensation fields, effectively freezing the magnetic fields at their tuned levels inside shield 510. At this point, the electrical currents through compensation coils 540a-540b may be deactivated and shield 510 will still contain the desired magnetic fields. This process of generating and trapping compensatory magnetic fields is known in the art and is described in, for example, U.S. Provisional Patent Application Ser. No. 60/981,763, filed Oct. 22, 2007 and entitled "Systems, Methods and Apparatus for Superconducting Magnetic Shielding."

Figure 6:
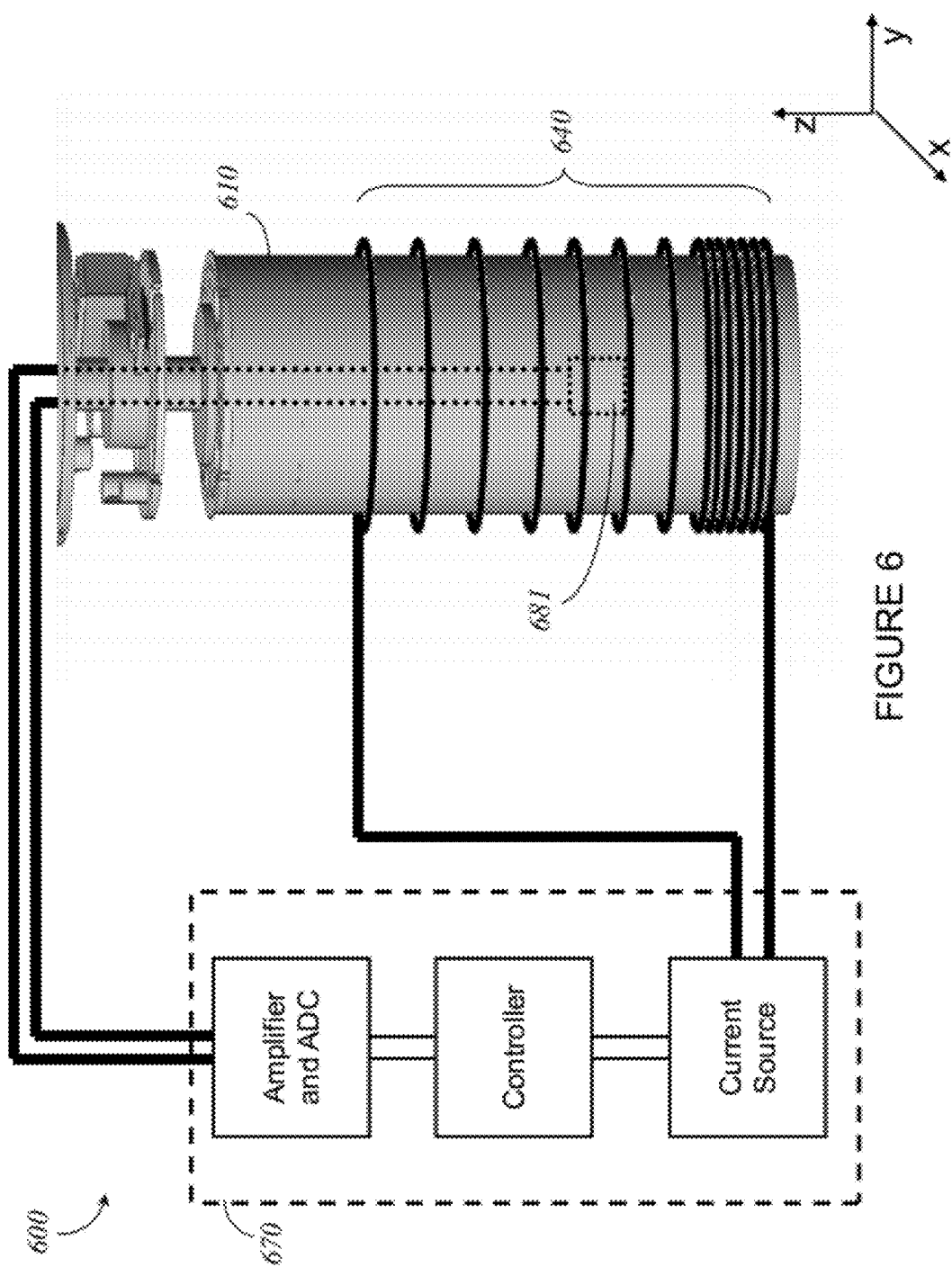
FIG. 6 is a schematic diagram of a combined shielding system showing compensation coils and an electrical current control system.

FIG. 6 is a schematic diagram of a combined shielding system 600 showing compensation coils 640 and an electrical current control system 670. System 600 operates in a similar way to system 500 from FIG. 5, except the embodiment shown FIG. 6 shows some detail of the compensation coils 640 and the electrical current control system 670. For instance, in some embodiments, electrical current control system 670 may include a current source that produces the current that drives compensation coils 640. System 670 may also include an amplifier that is connected to at least one measurement device 681 (shown in dashed lines to indicate that it is contained inside shield 610) and a feedback system in the form of a current controller that is coupled between the amplifier and the current source. Measurement device 681 may measure the magnetic fields inside shield 610 and may include, for example, a magnetometer. Those of skill in the art will appreciate that the specific devices and components of electrical current control system 670 may vary depending on the requirements of the compensatory magnetic shielding system.

In system 600, shield 610 may be a combined radiation shield and superconducting magnetic shield similar to shield 510 from FIG. 5. Those of skill in the art will appreciate that compensation coils 640 may be wrapped around the surface of shield 610 as drawn, or they may be wrapped around an outer surface that contains at least a portion of shield 610, such that at least a portion of shield 610 is enclosed by compensation coils 640. Furthermore, the packing density of compensation coils 640 (that is, the proximity of a first turn in the coil to a second turn in the coil) may vary over the length of shield 610. For example, in system 600, compensation coils 640 are packed more densely at the base of shield 610 than near the middle or top of shield 610. Varying the packing density of compensation coils 640 may be advantageous as a means for controlling the strength of the compensation fields generated in the region enclosed by the coils. For instance, in some embodiments it may be advantageous to produce compensation fields of greater strength near the base of shield 610, and thus compensation coils 640 are packed more tightly near the base of shield 610. Furthermore, while system 600 may produce compensation fields along the indicated z-direction, compensation fields may be produced in other directions by including compensation coils that are perpendicular to that direction.

Figure 7:
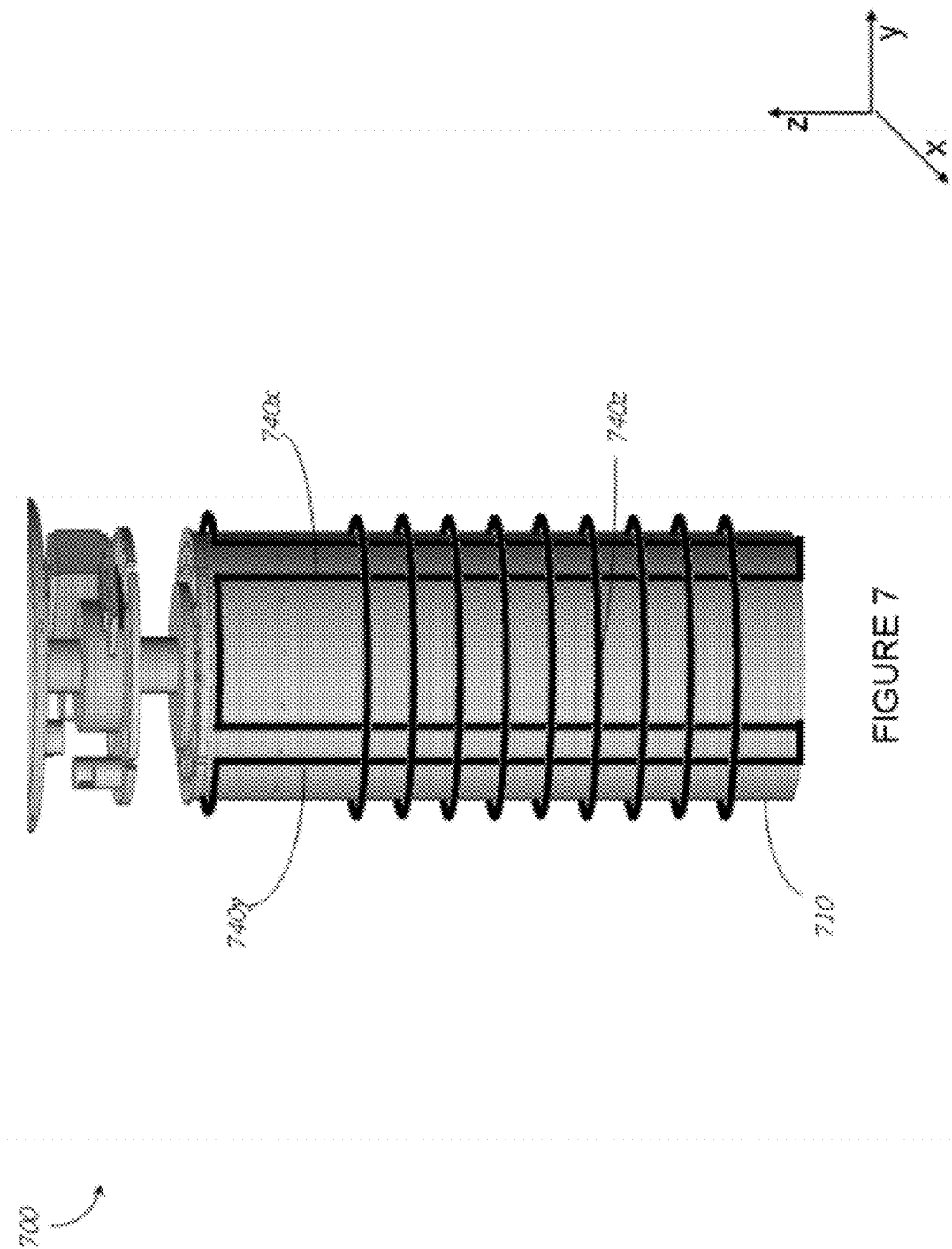
FIG. 7 is an isometric view of a combined shield system that includes three sets of compensation coils to produce magnetic fields in the x-direction, the y-direction, and the z-direction, respectively.

FIG. 7 is an isometric view of a combined shield system 700 that includes three sets of compensation coils 740x, 740y, and 740z to produce magnetic fields in the x-direction, the y-direction, and the z-direction, respectively. Each of compensation coils 740x-740z is wrapped around the surface of shield 710, though those of skill in the art will appreciate that any or all of coils 740x-740z may be wrapped around an alternative surface that at least partially encloses shield 710. Coils 740x may be wrapped on opposing sides of shield 710 (only one side visible) to produce magnetic fields in the x-direction on opposing sides of shield 710. For instance, coils 740x as illustrated form a coil along the length of shield 710 on one side of shield 710. In some embodiments, a similar coil (or coils) may be formed diametrically opposite coil 740x along the opposing side of shield 710. Coils 740y may produce magnetic fields in the y-direction and may similarly be wrapped on diametrically opposite sides of shield 710.

For three-dimensional magnetic field compensation, it may be necessary to include three-dimensional measurements of the magnetic fields inside shield 710. This may be accomplished using a single three-dimensional measurement device, or multiple one-dimensional measuring devices each arranged to measure the fields generated by a respective set of coils. For example, shield 710 may include three measurement devices, such as magnetometers, each arranged to measure magnetic fields in a respective one of the x-, y-, and z-directions. System 700 may therefore include three electrical current control systems (not shown) such as electrical current control system 670, or one electrical current control system that is capable of controlling all three directions of compensation.

Many refrigeration systems include a radiation shield that is used to help prevent blackbody radiation that is emitted by warmer bodies from being absorbed by colder bodies within the refrigeration system. In the present systems, methods and apparatus, such a radiation shield includes superconducting material and, while still providing the radiation shielding, may also be operated as a compensatory superconducting magnetic shield. This combined shielding saves the financial and labor expenses of having to produce two massive shields, and reduces consumption of cooling power from the refrigeration system as only one shield needs to be cooled. Furthermore, a single combined shield conserves space inside the refrigeration system, which can be of particular importance in applications where it is desired to minimize the size of the refrigeration system, and/or in applications that include extensive input/output components within the refrigeration system.

As previously described, the term "high thermal conductivity" is used herein in the context of radiation shielding to describe a material whose thermal conductivity is "suitably high" or "appropriately high" in order to satisfy the requirements of the radiation shield. For the purposes of the present systems, methods and apparatus, a requirement of the radiation shield is that it have a thermal conductivity that is higher than that of the superconducting plating at superconducting temperatures such that a degree of radiation shielding is achieved that is not attainable with a superconducting magnetic shield alone. In practice, the performance of a radiation shield is generally better the higher its thermal conductivity.

In various embodiments, certain aspects of the present systems, methods and apparatus may be realized at room temperature, and certain aspects may be realized at a superconducting temperature. Thus, throughout this specification and the appended claims, the term "superconducting" when used to describe a physical structure such as a "superconducting shield" is used to indicate a material that is capable of behaving as a superconductor at an appropriate temperature. A superconducting material may not necessarily be acting as a superconductor at all times in all embodiments of the present systems, methods and apparatus.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to combined superconducting magnetic shielding and radiation shielding systems, methods and apparatus, not necessarily the exemplary combined superconducting magnetic shielding and radiation shielding systems, methods, and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Pat. No. 6,838,694, U.S. Pat. No. 7,335,909, US Patent Publication No. 2006-0225165, US Patent Publication No. 2008-0176750, U.S. Provisional Patent Application Ser. No. 60/986,554 filed Nov. 8, 2007 and entitled "Systems, Devices and Methods for Analog Processing," and U.S. Provisional Patent Application Ser. No. 61/039,710, filed Mar. 26, 2008 and entitled "Systems, Devices, And Methods For Analog Processing", US Patent Publication No. 2006-0147154, U.S. patent application Ser. No. 12/017,995, and U.S. Provisional Patent Application Ser. No. 60/981,763, filed Oct. 22, 2007, entitled "Systems, Methods and Apparatus for Superconducting Magnetic Shielding," are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A shielding system comprising;
 a thermal radiation shield that is formed by a first material that has a high thermal conductivity, wherein at least a portion of the first material is plated with a second material that is superconductive below a critical temperature;
 at least one thermal contact between the first material and a refrigeration system;
 a current control system that includes at least one electrical current source;
 a first compensation coil formed by a conductive current path that is conductively coupled to the current control system;
 a first measurement device positioned to measure magnetic fields within the thermal radiation shield, the first measurement device communicatively coupled to the current control system; and
 a second measurement device that is communicatively coupled to the current control system.

2. The shielding system of claim 1 wherein the first measurement device includes a magnetometer.

3. The shielding system of claim 1 wherein the first material includes copper metal.

4. The shielding system of claim 1 wherein the second material includes tin metal.

5. The shielding system of claim 1, further comprising a device for which shielding from magnetic fields and shielding from infrared radiation are desired, wherein the device is at least partially contained within the thermal radiation shield.

6. The shielding system of claim 5 wherein the device includes a superconducting processor.

7. The shielding system of claim 6 wherein the device includes a superconducting quantum processor.

8. The shielding system of claim 1 wherein the second measurement device includes a magnetometer and wherein the first and the second measurement devices measure approximately perpendicularly to one another.

9. The shielding system of claim 1, further comprising at least a third measurement device that is communicatively coupled to the current control system.

10. The shielding system of claim 9 wherein at least two measurement devices measure approximately perpendicularly to one another.

11. A shielding system comprising:
a thermal radiation shield that is formed by a first material that has a high thermal conductivity, wherein a portion of the first material is plated with a second material that is superconductive below a critical temperature;
at least one thermal contact between the first material and a refrigeration system;
a current control system that includes at least one electrical current source;
a first compensation coil formed by a conductive current path that is conductively coupled to the current control system;
a first measurement device positioned to measure magnetic fields within the thermal radiation shield, the first measurement device communicatively coupled to the current control system; and
at least a second compensation coil formed by a conductive current path, wherein each compensation coil is conductively coupled to the current control system,
wherein at least two compensation coils are aligned approximately perpendicular to one another.

12. A shielding system, comprising:
a thermal radiation shield that is formed by a first material that has a high thermal conductivity, wherein a portion of the first material is plated with a second material that is superconductive below a critical temperature;
at least one thermal contact between the first material and a refrigeration system;
a current control system that includes at least one electrical current source, wherein the current control system includes at least one signal amplifier;
a first compensation coil formed by a conductive current path that is conductively coupled to the current control system; and
a first measurement device positioned to measure magnetic fields within the thermal radiation shield, the first measurement device communicatively coupled to the current control system.

13. A shielding system, comprising:
a thermal radiation shield that is formed by a first material that has a high thermal conductivity, wherein a portion of the first material is plated with a second material that is superconductive below a critical temperature;
at least one thermal contact between the first material and a refrigeration system;
a current control system that includes at least one electrical current source, wherein the current control system includes at least one analog-to-digital converter;
a first compensation coil formed by a conductive current path that is conductively coupled to the current control system; and
a first measurement device positioned to measure magnetic fields within the thermal radiation shield, the first measurement device communicatively coupled to the current control system.

14. The shielding system of claim 1 wherein both an inner surface and an outer surface of the thermal radiation shield are plated with the second material.

15. The shielding system of claim 1 wherein the thermal radiation shield is approximately cylindrical in geometry.

16. A method of shielding a device from magnetic fields and infrared radiation, the method comprising:
at least partially enclosing the device within a thermal radiation shield, wherein the thermal radiation shield is formed by a first material that has a high thermal conductivity, and wherein a portion of the first material is plated with a second material that is superconductive below a critical temperature;
measuring the magnetic fields in a first direction in close proximity to the device by a first measurement device;
measuring magnetic fields in a second direction by a second measurement device;
controlling a first current through a first compensation coil to generate a first compensation field;
controlling a second current through a second compensation coil to generate a second compensation field;
monitoring the magnetic fields in the first direction;
refining the first current until the magnetic fields in the first direction reach a desired level;
monitoring the magnetic fields in the second direction;
refining the second current until the magnetic fields in the second direction reach a desired level;
trapping the first compensation field within the thermal radiation shield;
trapping the second compensation field within the thermal radiation shield; and
cooling the first material that forms the thermal radiation shield to a temperature that is approximately equal to the temperature of the device via at least one thermal contact between the first material and a refrigeration system.

17. The method of claim 16 wherein the device includes a superconducting processor.

18. The method of claim 17 wherein the device includes a superconducting quantum processor.

19. The method of claim 16 wherein trapping includes cooling the material that forms the thermal radiation shield to a temperature below the critical temperature of the second material, such that the second material becomes superconducting.

20. The method of claim 16, further comprising:
deactivating the current once the first and the second compensation fields have been trapped.

* * * * *